(12) United States Patent (10) Patent No.: US 12,057,849 B2
Zhang et al. (45) Date of Patent: Aug. 6, 2024

(54) FREQUENCY SYNTHESIS SYSTEM AND FREQUENCY GENERATION METHOD OF MICROWAVE PHOTONS BASED ON PHOTOELECTRIC SYNERGY

(71) Applicant: CHINA ELECTRONICS TECHNOLOGY GROUP CORPORATION NO 44 RESEARCH INSTITUTE, Chongqing (CN)

(72) Inventors: Hao Zhang, Chongqing (CN); Botao Wang, Chongqing (CN); Siyu Tian, Chongqing (CN); Genyuan Yang, Chongqing (CN); Pengfei Qu, Chongqing (CN)

(73) Assignee: CHINA ELECTRONICS TECHNOLOGY GROUP CORPORATION NO 44 RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 18/175,552

(22) Filed: Feb. 28, 2023

(65) Prior Publication Data

US 2024/0118136 A1 Apr. 11, 2024

(30) Foreign Application Priority Data

Oct. 8, 2022 (CN) .......................... 202211223345.4

(51) Int. Cl.
*H03L 7/18* (2006.01)
*G01J 1/44* (2006.01)
(Continued)

(52) U.S. Cl.
CPC ................. *H03L 7/18* (2013.01); *G01J 1/44* (2013.01); *G02F 1/353* (2013.01); *G02F 1/37* (2013.01);
(Continued)

(58) Field of Classification Search
CPC ..... G01J 1/44; H03B 2200/009; H03B 21/02; H03B 17/00; H03B 21/00; H03L 7/18; G02F 1/353; G02F 1/37
See application file for complete search history.

(56) References Cited

U.S. PATENT DOCUMENTS

2021/0368612 A1* 11/2021 Porte ..................... G01C 19/62

FOREIGN PATENT DOCUMENTS

| CN | 105259724 A | * | 1/2016 | |
| CN | 109343031 A | * | 2/2019 | ............. G01S 7/483 |
| CN | 113451868 A | * | 9/2021 | |

* cited by examiner

*Primary Examiner* — Jennifer D Bennett (57) ABSTRACT

A frequency synthesis system and a frequency generation method of microwave photons based on photoelectric synergy are provided, the system includes an optical frequency comb for generating narrow optical pulse signals with high stability and low phase noise through; an optical frequency doubling/dividing unit for performing frequency doubling or frequency dividing on a repetition frequency of the narrow optical pulse signals output by the optical frequency comb; a photoelectric conversion unit for performing photoelectric conversion on input optical pulse signals, and outputting an electrical frequency comb; a second electrical filter unit for filtering input electrical signals; and a second electrical amplifying unit for performing power amplification on the input electrical signals. An operation frequency and performance of the optical frequency comb is three orders of magnitude or higher than that of common microwave frequency sources, microwave frequency signals with larger frequency range and better performance can be generated.

3 Claims, 7 Drawing Sheets

(51) Int. Cl.
*G02F 1/35* (2006.01)
*G02F 1/37* (2006.01)
*H03B 17/00* (2006.01)
*H03B 21/00* (2006.01)
*H03B 21/02* (2006.01)

(52) U.S. Cl.
CPC ............ *H03B 17/00* (2013.01); *H03B 21/00* (2013.01); *H03B 21/02* (2013.01); *H03B 2200/009* (2013.01)

FREQUENCY SYNTHESIS SYSTEM AND FREQUENCY GENERATION METHOD OF MICROWAVE PHOTONS BASED ON PHOTOELECTRIC SYNERGY

TECHNICAL FIELD

The subject matter herein generally relates to a technology field of frequency synthesis of microwave photons, and particularly to a frequency synthesis system and a frequency generation method of microwave photons based on photoelectric synergy.

BACKGROUND

Frequency synthesis is a supporting technology for radars, satellites, ground communication, position sensing, navigation technologies, and many other core defense capabilities. With the development requirement of bottleneck breakthrough and upgrading of the electronic information systems, ultra-wideband arbitrary waveform generation with ultra-low phase noise has become one of the important fields and directions of technology development of frequency synthesis, and with the requirement for miniaturization and higher performance of the electronic systems, for the design of miniaturization, fine stepping, low spurious, and low phase noise generated by wideband arbitrary waveforms, higher requirements are also put forward.

Conventional microwave signal generation with low phase noise is realized by using a microwave oscillator including a quartz crystal and a dielectric resonator etc. Although the phase noise of the microwave oscillator can reach −160 dBc/Hz or even lower when the frequency deviation is 10 kHz, the output frequency is only tens of MHz; a Q value of the dielectric resonator decreases linearly with the increase of the output frequency; the atomic clock with high precision has very high stability and excellent phase noise, and, generally, the output frequency is 10 MHz. In order to generate a higher frequency, electrical frequency doubling is required, however, the phase noise will deteriorate logarithmically by 20 times, which can no longer meet the requirements of the electronic information system of next generation for the frequency signals with high frequency, high stability, and low phase noise.

With the rapid development of microwave photonic technology, the generation of X-band signals based on photoelectric oscillators has achieved a phase noise of −163 dBc/Hz@6 kHz, and the generation of X-band signals based on optical frequency combs has achieved a phase noise of better than −170 dBc/Hz@10 kHz. However, in terms of frequency synthesis, due to the limit of tuning mechanism, the indicators such as phase noise and stability are far behind the generation of point frequency signals, thus, it is urgent to carry out a new mechanism study for high-performance frequency synthesis.

SUMMARY

In view of the shortcomings of the prior art, the problem to be solved according to the present disclosure is to provide a frequency synthesis system and a frequency generation method of microwave photons based on photoelectric synergy.

To achieve the above purpose, the present disclosure provides the following embodiment:

A frequency synthesis system of microwave photons based on photoelectric synergy, comprising:

an optical frequency comb configured to generate narrow optical pulse signals with high stability and low phase noise;

an optical frequency doubling/dividing unit configured to perform frequency doubling or frequency dividing on a repetition frequency of the narrow optical pulse signals output by the optical frequency comb;

a photoelectric conversion unit configured to perform photoelectric conversion on input optical pulse signals, and output an electrical frequency comb;

a second electrical filter unit configured to filter input electrical signals; and a second electrical amplifying unit configured to perform power amplification on the input electrical signals;

the optical frequency comb is connected with the optical frequency doubling/dividing unit, the optical frequency doubling/dividing unit is connected with the photoelectric conversion unit, the photoelectric conversion unit is electrically connected with the second electrical filter unit, and the second electrical filter unit is electrically connected with the second electrical amplifying unit.

A frequency generation method of microwave photons based on photoelectric synergy, comprising:

after performing frequency doubling or frequency dividing on narrow optical pulse signals generated by an optical frequency comb, determining whether a frequency that is required to be generated of signals is capable of being obtained through photoelectric conversion;

in response that the frequency that is required to be generated of the signals is capable of being obtained through the photoelectric conversion, generating signals to be generated by using a direct photoelectric conversion method;

in response that the frequency that is required to be generated of the signals is not capable of being obtained through the photoelectric conversion, determining whether the frequency that is required to be generated of the signals is less than a predetermined frequency threshold;

in response that the frequency that is required to be generated of the signals is less than the predetermined frequency threshold, generating the signals to be generated by using an electrical frequency synthesis method; and in response that the frequency that is required to be generated of the signals is not less than the predetermined frequency threshold, generating the signals to be generated by using an optical frequency shifting method.

This embodiment applies the optical frequency comb as the frequency source, since the operation frequency of the optical frequency comb is three orders of magnitude or higher than that of common microwave frequency sources (e.g., the crystal oscillator), and its performance is three orders of magnitude or higher than that of the common microwave frequency sources, therefore, the frequency synthesis system provided in this embodiment can generates the frequency with a larger frequency range and higher performance. In addition, the frequency synthesis system in this embodiment can switch among the three operating modes of direct photoelectric conversion mode, electrical frequency synthesis mode, and optical frequency shifting mode as required, and can perform the frequency shifting on the narrow optical pulse signals generated by the optical frequency comb, so as to obtain the frequency signals of ultra-wide band and continuous tuning.

BRIEF DESCRIPTION OF THE DRAWINGS

In order to clearly explain technical solutions of embodiments of the present disclosure or in the related art, drawings used in the description of the embodiments or the related art are briefly described below. Obviously, the drawings as described below are merely some embodiments of the present disclosure. Based on these drawings, other drawings can be obtained by those skilled in the art without paying creative efforts.

DETAILED DESCRIPTION

Multiple embodiments are described in the present disclosure, but the description is exemplary rather than limiting, and there may be more embodiments and implementation solutions within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with or in place of any other feature or element of any other embodiment.

When describing representative embodiments, the specification may have presented methods and/or processes as a specific sequence of steps. However, to the extent that the method or process does not depend on the specific order of steps described in the present disclosure, the method or process should not be limited to the specific order of steps described. As understood by those of ordinary skills in the art, other orders of steps are also possible. Therefore, the specific order of steps set forth in the specification should not be interpreted as limitation to the claims. In addition, the claims for the method and/or process should not be limited to the steps performed in the written order, and those of skilled in the art may readily understand that these orders may vary and still remain within the essence and scope of the embodiments of the present disclosure.

Unless otherwise defined, technical terms or scientific terms used in the embodiments shall have common meanings as construed by those of ordinary skills in the art to which the present disclosure pertains. The terms "first", "second" and the like used in the embodiments of the present disclosure do not represent any order, quantity or importance, but are merely configured to distinguish among different components. The terms "include", "contain" or the like mean that elements or articles appearing before the words cover elements or articles listed after the words and their equivalents, without excluding other elements or articles. The terms "connect", "link" or the like are not limited to physical or mechanical connection, but may include electrical connection, whether direct or indirect.

A frequency synthesis system of microwave photons based on photoelectric synergy is provided. The frequency synthesis system of microwave photons based on photoelectric synergy is described according to the following three embodiments.

Embodiment 1

Figure 1:
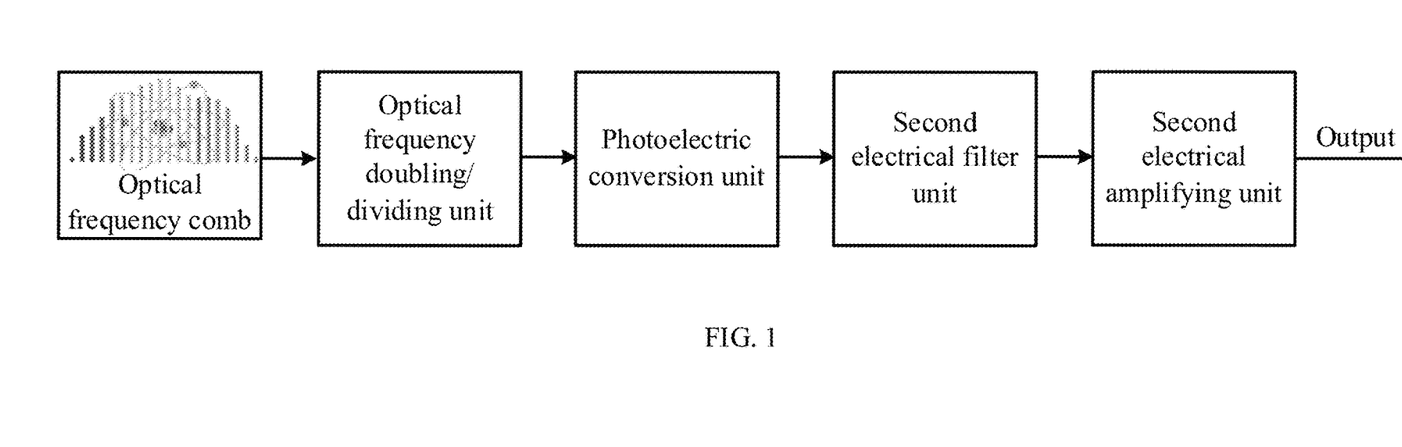
FIG. 1 illustrates a block diagram of an embodiment of a frequency synthesis system of microwave photons based on photoelectric synergy according to the present disclosure.

Referring to FIG. 1, a preferred embodiment of the frequency synthesis system of microwave photons based on photoelectric synergy is illustrated. The frequency synthesis system includes an optical frequency comb, an optical frequency doubling/dividing unit, a photoelectric conversion unit, a second electrical filter unit, and a second electrical amplifying unit. The optical frequency comb is connected with an optical frequency doubling/dividing unit through an optical path (e.g., an optical fiber), the optical frequency doubling/dividing unit is connected with the photoelectric conversion unit through the optical path, the photoelectric conversion unit is electrically connected with the second electrical filter unit, and the second electrical filter unit is electrically connected with the second electrical amplifying unit. In one embodiment, the optical frequency doubling/dividing unit can be a fiber optic Mach-zender interferometer, the photoelectric conversion unit can be an optical detector, the second electrical filter unit can be an electric filter, the second electrical amplifying unit can be an electric low-noise amplifier.

The optical frequency comb is configured to generate narrow optical pulse signals with high stability and low phase noise; for example, the optical frequency comb can output narrow optical pulse signals with a pulse width of 100 fs; the pulse width can also be greater or less than 100 fs. The optical frequency doubling/dividing unit is configured to perform frequency doubling or frequency dividing on the repetition frequency of the optical pulse signals output by the optical frequency comb, the optical frequency doubling/dividing unit can be a repetition frequency converter including a Fiber MZI (Mach-Zehnder interferometer), photonic crystals, etc. The photoelectric conversion unit is configured to perform photoelectric conversion on the optical pulse signals from the optical frequency doubling/dividing unit, and output an electrical frequency comb. The second electrical filter unit is a bandpass filter for filtering the electrical signals from the photoelectric conversion unit (i.e., performing a filtering process on the electrical signals). The second electrical amplifying unit is configured to perform power amplification on the electrical signals filtered by the second electrical filter unit.

The operating principle of this embodiment is as follows.

As illustrated in FIG. 1, in this embodiment, the frequency synthesis system adopts a direct photoelectric conversion mode. When operating, the optical frequency comb generates narrow optical pulse signals with high stability and low phase noise, and transmits the narrow optical pulse signals to the optical frequency doubling/dividing unit; the optical frequency doubling/dividing unit performs frequency doubling or frequency dividing on the narrow optical pulse signals; the photoelectric conversion unit performs photoelectric conversion on the narrow optical pulse signals and generates an electrical frequency comb; the second electrical filter unit performs a filtering process on the electrical frequency comb, and filters out the signals with a required frequency from the electrical frequency comb; the second electrical amplifying unit performs power amplification on the filtered signals with the required frequency and outputs the signals.

An example of generating microwave signals with a frequency of 9.6 GHz is described as follows.

The optical frequency comb generates the narrow optical pulse signals with a repetition frequency of 200 MHz which have high stability and low phase noise; the optical frequency doubling/dividing unit performs frequency doubling on the repetition frequency of the narrow optical pulse signals by 8, the photoelectric conversion unit performs the photoelectric conversion on the narrow optical pulse signals and generates an electrical frequency comb with an interval of 1.6 GHz. A filtering frequency of the second electrical filter unit is set to 9.6 GHz, the second electrical filter unit filters out the signals with the frequency of 9.6 GHz from the electrical frequency comb with the interval of 1.6 GHz; the second electrical amplifying unit performs the power amplification on the filtered signals with the frequency of 9.6 GHz, thereby obtaining the signals with the required frequency and outputting the signals to users.

In this embodiment, the optical frequency comb is used as the frequency source, since the operation frequency of the optical frequency comb is three orders of magnitude or higher than that of common microwave frequency sources (e.g., the crystal oscillator), and its performance is three orders of magnitude or higher than that of the common microwave frequency sources, therefore, the frequency synthesis system provided in this embodiment can generates the frequency with a larger frequency range and higher performance. In addition, this embodiment adopts the direct photoelectric conversion mode to obtain the required frequency signals, and the structure is simple. However, this embodiment can filter out the required frequency from the electrical frequency comb, the frequency points that can be generated are discrete, the frequency signals that are continuously tuned cannot be generated.

Embodiment 2

Figure 2:
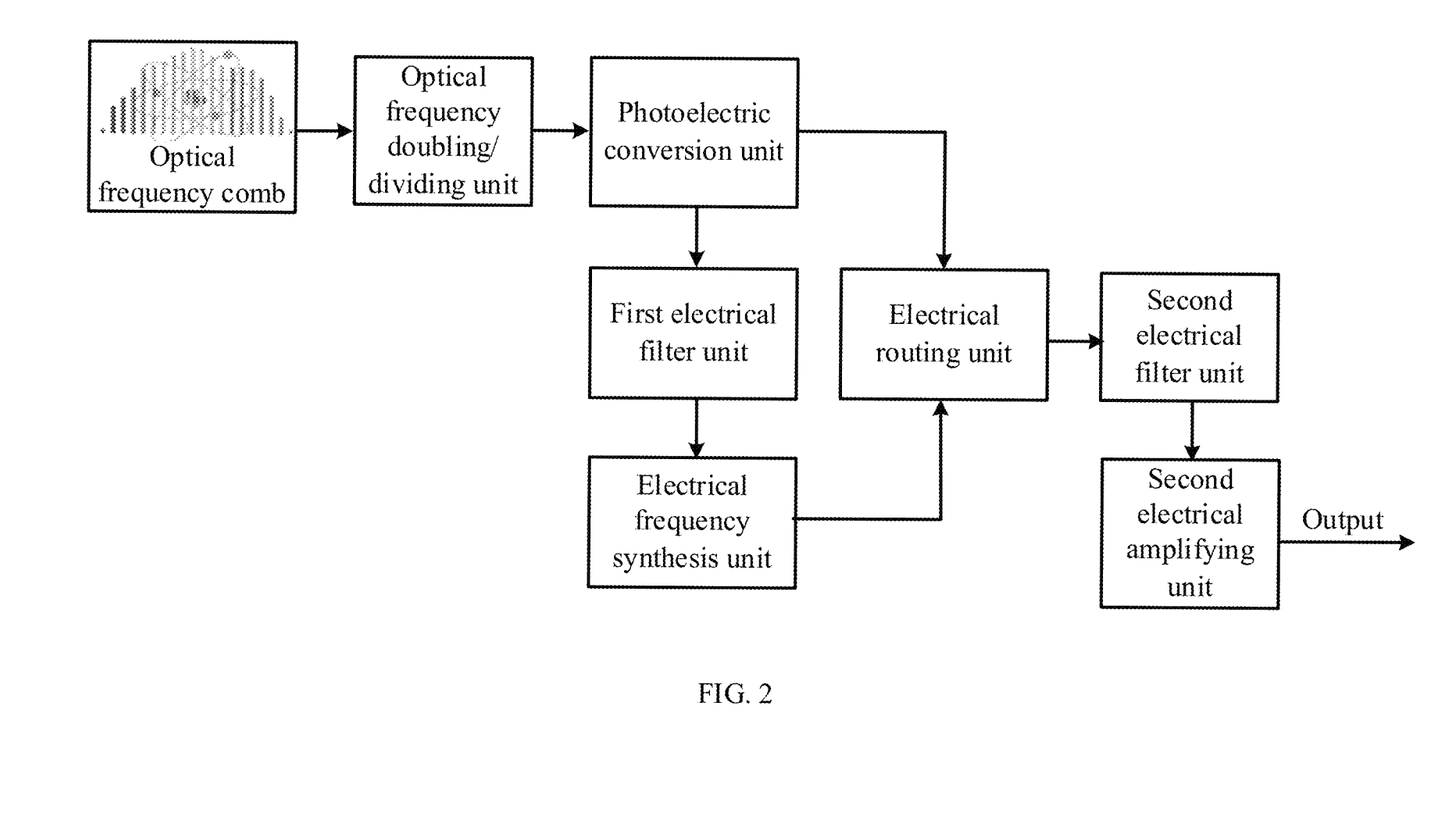
FIG. 2 illustrates a block diagram of another embodiment of the frequency synthesis system of microwave photons based on photoelectric synergy according to the present disclosure.

Referring to FIG. 2, another preferred embodiment of the frequency synthesis system of microwave photons based on photoelectric synergy is illustrated. The frequency synthesis system includes an optical frequency comb, an optical frequency doubling/dividing unit, a photoelectric conversion unit, a first electrical filter unit, an electrical frequency synthesis unit, an electrical routing unit, a second electrical filter unit, and a second electrical amplifying unit. The optical frequency comb is connected with the optical frequency doubling/dividing unit through the optical path, the optical frequency doubling/dividing unit is connected with the photoelectric conversion unit through the optical path, and the photoelectric conversion unit is electrically connected with the second electrical filter unit through the electrical routing unit. In detail, an output end of the photoelectric conversion unit is electrically connected with a first input end of the electrical routing unit, an output end of the electrical routing unit is electrically connected with an input end of the second electrical filter unit, and an output end of the second electrical filter unit is electrically connected with an input end of the second electrical amplifying unit. The output end of the photoelectric conversion unit is further electrically connected with the input end of the first electrical filter unit, the output end of the first electrical filter unit is electrically connected with the input end of the electrical frequency synthesis unit, and the output end of the electrical frequency synthesis unit is electrically connected with the second input end of the electrical routing unit.

The functions of the optical frequency comb, the optical frequency doubling/division unit, the photoelectric conversion unit, the second electrical filter unit, and the second electrical amplifying unit are the same as those of Embodiment 1, the first electrical filter unit is an electric bandpass filter, the first electrical filter unit is configured to perform frequency selection of the electrical frequency comb transmitted from the photoelectric conversion unit. The electrical frequency synthesis unit is configured to output synthesized frequency signals according to clock signals or local oscillator signals input by the first electrical filter unit, the electrical frequency synthesis unit may perform the frequency synthesis by using an electrical phase-locking method. The electrical routing unit is configured to perform path selection of the electrical signals, and can select to connect the photoelectric conversion unit with the second electrical filter unit, disconnect the electrical frequency synthesis unit with the second electrical filter unit, or disconnect the photoelectric conversion unit with the second electrical filter unit, connect the electrical frequency synthesis unit with the second electrical filter unit. The second electrical filter unit is configured to filter the frequency signals from the electrical routing unit.

In one embodiment, the electrical frequency synthesis can be an electric digital synthesizer, the electrical routing unit can be a 1*2 optical switch, that is, a single-pole double-throw switch, the first electrical filter unit can be an electric filter.

The operating principle of this embodiment is as follows.

As illustrated in FIG. 2, in this embodiment, the frequency synthesis system has two operating modes, a first working mode is the direct photoelectric conversion mode, at this time, the electrical routing unit connects the photoelectric conversion unit with the second electrical filter unit, and disconnects the electrical frequency synthesis unit with the second electrical filter unit, the operating principle of the direct photoelectric conversion mode is the same as that of Embodiment 1, which is not be repeated. A second operating mode is an electrical frequency synthesis mode, at this time, the electrical routing unit disconnects the photoelectric conversion unit with the second electrical filter unit, and connects the electrical frequency synthesis unit with the second electrical filter unit. The operating process of the electrical frequency synthesis mode is as follows.

The optical frequency comb generates narrow optical pulse signals with high stability and low phase noise, and transmits the narrow optical pulse signals to the optical frequency doubling/dividing unit; after the optical frequency doubling/dividing unit performs frequency doubling or frequency dividing on the narrow optical pulse signals, the photoelectric conversion unit performs the photoelectric conversion on the narrow optical pulse signals and generates an electrical frequency comb. Since the electrical routing unit disconnects the photoelectric conversion unit with the second electrical filter unit, the electrical frequency comb generated by the photoelectric conversion unit is transmitted to the first electrical filter unit for the filtering process, and the first electrical filter unit filters out the signals with the specific frequency from the electrical frequency comb, takes the signals with the specific frequency as frequency reference signals or local oscillator signals, and transmit the signals with the specific frequency to the electrical frequency synthesis unit. The electrical frequency synthesis unit outputs synthesized frequency signals according to the clock signals or the local oscillator signals input by the first electrical filter unit. Since the electrical routing unit connects the electrical frequency synthesis unit with the second electrical filter unit, thus, the second electrical filter unit filters out the signals with the required frequency from the electrical frequency signals, and the second electrical amplifying unit performs power amplification on the signals with the required frequency filtered by the second electrical filter unit and outputs the signals.

An example of generating microwave signals with a frequency of 350 MHz is described as follows.

The optical frequency comb generates narrow optical pulse signals with a repetition frequency of 200 MHz which have high stability and low phase noise; the optical frequency doubling/dividing unit performs frequency doubling on the repetition frequency of the narrow optical pulse signals by 2, the photoelectric conversion unit performs the photoelectric conversion on the narrow optical pulse signals and generates an electrical frequency comb with an interval of 100 MHz. A filtering frequency (i.e., a passing frequency) of the first electrical filter unit is set to 100 MHz, the first electrical filter unit filters out the signals with the frequency of 100 MHz from the electrical frequency comb as the frequency reference signals or local oscillator signals, and transmits the signals with the frequency of 100 MHz to the electrical frequency synthesis unit; the electrical frequency synthesis unit generates the required signals with the frequency of 350 MHz according to the signals with the frequency of 100 MHz by using the electrical phase-locking method, and transmits the required signals to the second electrical filter unit; a filtering frequency (i.e., a passing frequency) of the second electrical filter unit is set to 350 MHz, the second electrical filter unit removes the signals with other frequencies such as harmonics; the second electrical amplifying unit performs the power amplification on the filtered signals with the frequency of 350 MHz, thereby obtaining the signals with the required frequency of 350 MHz and outputting the signals to the users.

In this embodiment, the optical frequency comb is used as the frequency source, since the operation frequency of the optical frequency comb is three orders of magnitude or higher than that of common microwave frequency sources (e.g., the crystal oscillator), and its performance is three orders of magnitude or higher than that of the common microwave frequency sources, therefore, the frequency synthesis system provided in this embodiment can generates the frequency with a larger frequency range and higher performance. In addition, since the frequency in this embodiment is synthesized by the electrical frequency synthesis unit by using the electrical phase-locking method, which is more suitable for generating signals with a lower frequency.

Embodiment 3

Figure 3:
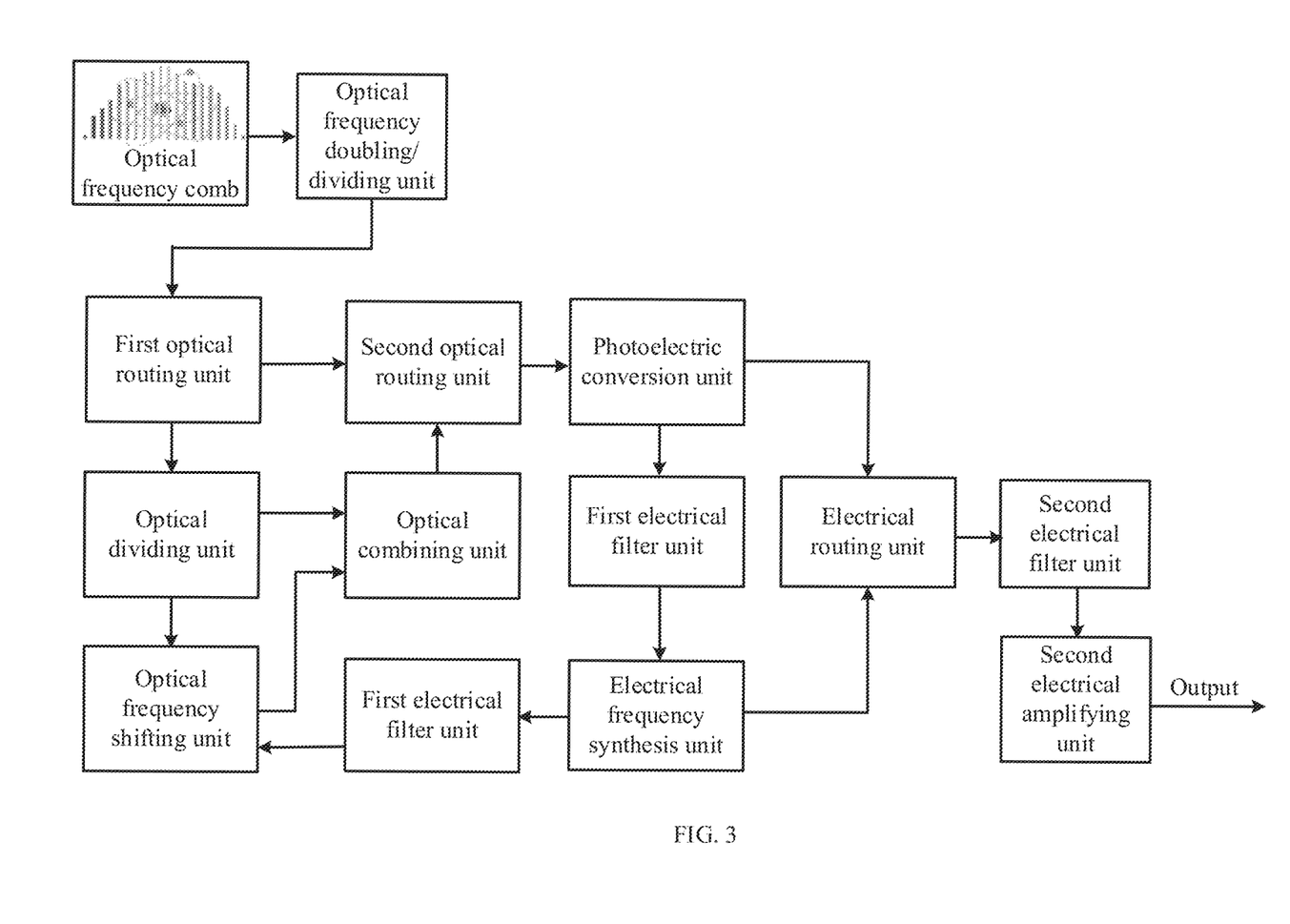
FIG. 3 illustrates a block diagram of another embodiment of the frequency synthesis system of microwave photons based on photoelectric synergy according to the present disclosure.

Referring to FIG. 3, another preferred embodiment of the frequency synthesis system of microwave photons based on photoelectric synergy is illustrated. The frequency synthesis system includes an optical frequency comb, an optical frequency doubling/dividing unit, a first optical routing unit, a second optical routing unit, an optical dividing unit, an optical combining unit, an optical frequency shifting unit, a first electrical amplifying unit, a photoelectric conversion unit, a first electrical filter unit, an electrical frequency synthesis unit, an electrical routing unit, a second electrical filter unit, and a second electrical amplifying unit.

The optical frequency comb is connected with the optical frequency doubling/dividing unit through an optical path, and the optical frequency doubling/dividing unit is connected with the photoelectric conversion unit through the first optical routing unit and the second optical routing unit; the output end of the optical frequency doubling/dividing unit is connected with the input end of the first optical routing unit through an optical path, the first output end of the first optical routing unit is connected with the first input end of the second optical routing unit through an optical path, the output end of the second optical routing unit is connected with the photoelectric conversion unit through an optical path.

The second output end of the first optical routing unit is connected with the input end of the optical dividing unit through an optical path, and the first output end of the optical dividing unit is connected with the first input end of the optical combining unit through an optical path, the optical dividing unit and the optical combining unit form an MZI structure. The second output end of the optical dividing unit is connected with the optical input end of the optical frequency shifting unit through an optical path; the output end of the optical frequency shifting unit is connected with the second input end of the optical combining unit through an optical path, and the output end of the optical combining unit is connected with the second input end of the second optical routing unit through an optical path.

The output end of the photoelectric conversion unit is electrically connected with the first input end of the electrical routing unit, the output end of the photoelectric conversion unit is further electrically connected with the first electrical filter unit, the first electrical filter unit is electrically connected with the electrical frequency synthesis unit, the output end of the electrical frequency synthesis unit is electrically connected with the input end of the first electrical amplifying unit, and the output end of the first electrical amplifying unit is electrically connected with the electrical input end of the optical frequency shifting unit. The output end of the electrical frequency synthesis unit is further electrically connected with the second input end of the electrical routing unit. The output end of the electrical routing unit is electrically connected with the input end of the second electrical filter unit, and the output end of the second electrical filter unit is electrically connected with the input end of the second electrical amplifying unit.

The functions of the optical frequency comb, the optical frequency doubling/dividing unit, the photoelectric conversion unit, the first electrical filter unit, the electrical frequency synthesis unit, the electrical routing unit, the second electrical filter unit, and the second electrical amplifying unit is the same as those of the Embodiment 2. The first optical routing unit is configured to perform path selection when optical dividing, and the second optical routing unit is configured to perform path selection when optical combining. The optical dividing unit is configured to divides the optical pulse signals output by the second output end of the first optical routing unit into two channels for output. The optical combining unit is configured to combine the optical pulse signals transmitted by the optical dividing unit and the optical frequency shifting unit into one channel and output the combined signals. The optical frequency shifting unit is configured to perform an upward or downward frequency shifting process on the optical pulse signals transmitted from the optical dividing unit according to the electrical frequency signals transmitted from the first electrical amplifying unit. The first electrical amplifying unit is configured to amplify the power of the electrical signals output by the electrical frequency synthesis unit and transmit the electrical signals to the optical frequency shifting unit.

In one embodiment, the first optical routing unit and the second optical routing unit can both be a 1*2 optical switch, the optical dividing unit and the optical combining unit can both be an optical coupler with a splitting ratio of 50:50, the optical frequency shifting unit can be an acousto-optic frequency shifter, the first electrical amplifying unit can be an electric low-noise amplifier.

The operating principle of this embodiment is as follows.

As illustrated in FIG. 3, in this embodiment, the frequency synthesis system has three operating modes. When the input end of the first optical routing unit is connected with the first output end of the first optical routing unit, and the output end of the second optical routing unit is connected with the first input end of the second optical routing unit, the optical frequency doubling/dividing unit is directly connected with the photoelectric conversion unit through the first optical routing unit and the second optical routing unit. At this time, the operating principle is the same as that of Embodiment 2, that is, according to the two connection modes of the electrical routing unit, there are two operating modes including the direct photoelectric conversion mode and the electrical frequency synthesis mode, which is not described in detail.

When the input end of the first optical routing unit is connected with the second output end of the first optical routing unit, and the output end of the second optical routing unit is connected with the second input end of the second optical routing unit, the electrical routing unit further connects the photoelectric conversion unit with the second electrical filter unit, and disconnects the electrical frequency synthesis unit with the second electrical filter unit; at this time, the frequency synthesis system is in an optical frequency shifting mode, and the operating process of the optical frequency shifting mode is as follows.

The optical frequency comb generates narrow optical pulse signals with high stability and low phase noise, and transmits the narrow optical pulse signals to the optical frequency doubling/dividing unit; after the optical frequency doubling/dividing unit performs the frequency doubling or frequency dividing on the narrow optical pulse signals, the narrow optical pulse signals are transmitted to the optical dividing unit through the first optical routing unit by the optical frequency doubling/dividing unit, the optical dividing unit divides the narrow optical pulse signals into two channels, one channel is output to the optical combining unit, and the other channel is output to the optical frequency shifting unit. The optical frequency shifting unit performs the upward or downward frequency shifting process on the optical pulse signals transmitted by the optical dividing unit according to the electrical frequency signals input by the first electrical amplifying unit, and transmits the optical pulse signals to the optical combining unit; the optical combining unit combines the optical pulse signals transmitted by the optical dividing unit and the optical frequency shifting unit into one channel, and transmits the combined optical pulse signals to the photoelectric conversion unit through the second optical routing unit for photoelectric conversion to generate an electrical frequency comb.

Under the optical frequency shifting mode, the electrical routing unit connects the photoelectric conversion unit with the second electrical filter unit, thus, the electrical frequency comb generated by the photoelectric conversion unit is transmitted to the second electrical filter unit and the first electrical filter unit, respectively; one channel of the electrical frequency comb is passed through the second electrical filter unit, the signals with the required frequency are filtered out from the electrical frequency comb, and the second electrical amplifying unit performs power amplification on the signals with the required frequency filtered by the second electrical filter unit and outputs the signals with the required frequency. The other channel of the electrical frequency comb is passed through the first electrical filter unit, the signals with the specific frequency are filtered out from the electrical frequency comb as the frequency reference signals or the local oscillator signals, and the signals with the specific frequency are transmitted to the electrical frequency synthesis unit, the electrical frequency synthesis unit outputs the synthesized frequency signals according to the clock signals or the local oscillator signals input by the first electrical filter unit. Under the optical frequency shifting mode, the electrical routing unit disconnects the electrical frequency synthesis unit with the second electrical filter unit, thus, the synthesized frequency signals output by the electrical frequency synthesis unit are first transmitted to the first electrical amplifying unit for amplification, and then transmitted to the optical frequency shifting unit as driving signals for upward or downward frequency shifting.

An example of generating microwave signals with a frequency of 32.3 GHz is described as follows:

The optical frequency comb generates narrow optical pulse signals with a repetition frequency of 200 MHz which have high stability and low phase noise; the optical frequency doubling/dividing unit performs the frequency doubling process on the repetition frequency of the narrow optical pulse signals by 8, the optical dividing unit and optical combining unit form an MZI structure, the optical pulse signals after the frequency doubling process are divided into two channels, one channel is upward frequency shifted by 300 MHz through the optical frequency shifting unit, and then the signals of the channel and the signals without the frequency shifting of the other channel are combined into one channel in the optical combining unit, the photoelectric conversion unit performs the photoelectric conversion on the narrow optical pulse signals and generates the electrical frequency comb. The electrical frequency comb is divided into two channels, one channel is transmitted to the first electrical filter unit, and the pass frequency (i.e., the filtering frequency) of the first electrical filter unit is set to 1.6 GHz, thus, the first electrical filter unit filters out the signals with a frequency of 1.6 GHz as the frequency reference signals or the local oscillator signals, and transmits the signals with the frequency of 1.6 GHz to the electrical frequency synthesis unit, the electrical frequency synthesis unit outputs the synthesized frequency signals of 300 MHz according to the signals with the frequency of 1.6 GHz; the synthesized frequency signals of 300 MHz are amplified by the first electrical amplifying unit and then transmitted to the optical frequency shifting unit as the driving signals for upward frequency shifting. The other channel of the electrical frequency comb is transmitted to the second electrical filter unit, and the pass frequency of the second electrical filter unit is set to 32.3 GHz, thus, the second electrical filter unit filters out the signals with a frequency of 32.3 GHz from the electrical frequency comb; the second electrical amplifying unit performs the power amplification on the filtered signals with the frequency of 32.3 GHz, obtains the required frequency signals, and output the required frequency signals to the users.

In this embodiment, the optical frequency comb is used as the frequency source, since the operation frequency of the optical frequency comb is three orders of magnitude or higher than that of common microwave frequency sources (e.g., the crystal oscillator), and its performance is three orders of magnitude or higher than that of the common microwave frequency sources, therefore, the frequency synthesis system provided in this embodiment can generates the frequency with a larger frequency range and higher performance. In addition, the frequency synthesis system in this embodiment can switch among the three operating modes of direct photoelectric conversion mode, electrical frequency synthesis mode, and optical frequency shifting mode as required, and can perform the frequency shifting on the narrow optical pulse signals generated by the optical frequency comb, so as to obtain the frequency signals of ultra-wide band and continuous tuning.

Figure 4:
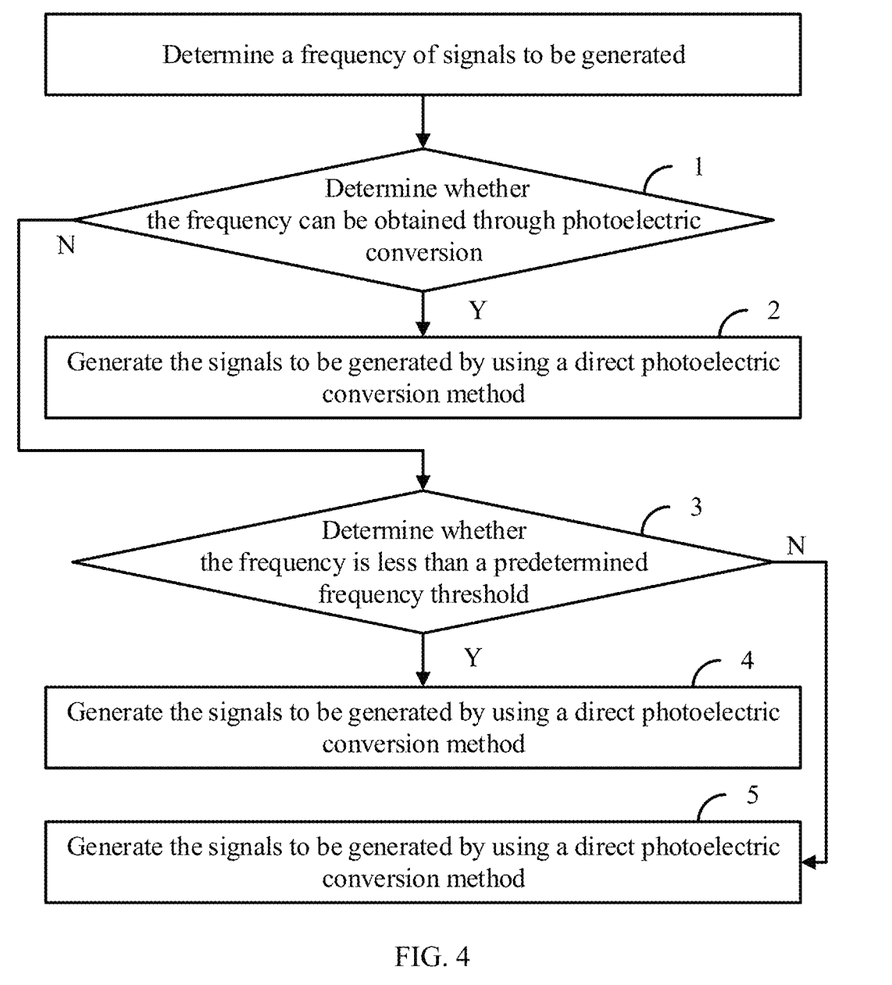
FIG. 4 illustrates a flowchart of an embodiment of a frequency generation method of microwave photons based on photoelectric synergy according to the present disclosure.

FIG. 4 illustrates a flowchart of an embodiment of a frequency generation method based on photoelectric synergy. The method is provided by way of example, as there are a variety of ways to carry out the method. Each block shown in FIG. 4 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 1.

At block 1, after performing a frequency doubling or frequency dividing process on the narrow optical pulse signals generated by the optical frequency comb, determine whether a frequency that is required to be generated of the signals can be obtained through photoelectric conversion, when it is determined that the frequency that is required to be generated of the signals can be obtained through the photoelectric conversion, the process goes to block 2; when it is determined that the frequency that is required to be generated of the signals cannot be obtained through the photoelectric conversion, the process goes to block 3.

It is assumed that the optical frequency comb generates narrow optical pulse signals with a repetition frequency of 200 MHz, if signals with a frequency of 9.6 GHz are required to be generated, the narrow optical pulse signals with the repetition frequency of 200 MHz generated by the optical frequency comb is performed the frequency doubling process of 8, and is performed photoelectric conversion, to obtain the electrical frequency comb with an interval of a 1.6 GHz, the electrical frequency comb includes the signals of 9.6 GHz, thus, the block 2 can be performed to generate the signals of 9.6 GHz by the direct photoelectric conversion. If the signals with a frequency of 350 MHz or 32.3 GHz are required to be generated, the frequency cannot be generated by the direct photoelectric conversion, and block 3 is performed.

Figure 5:
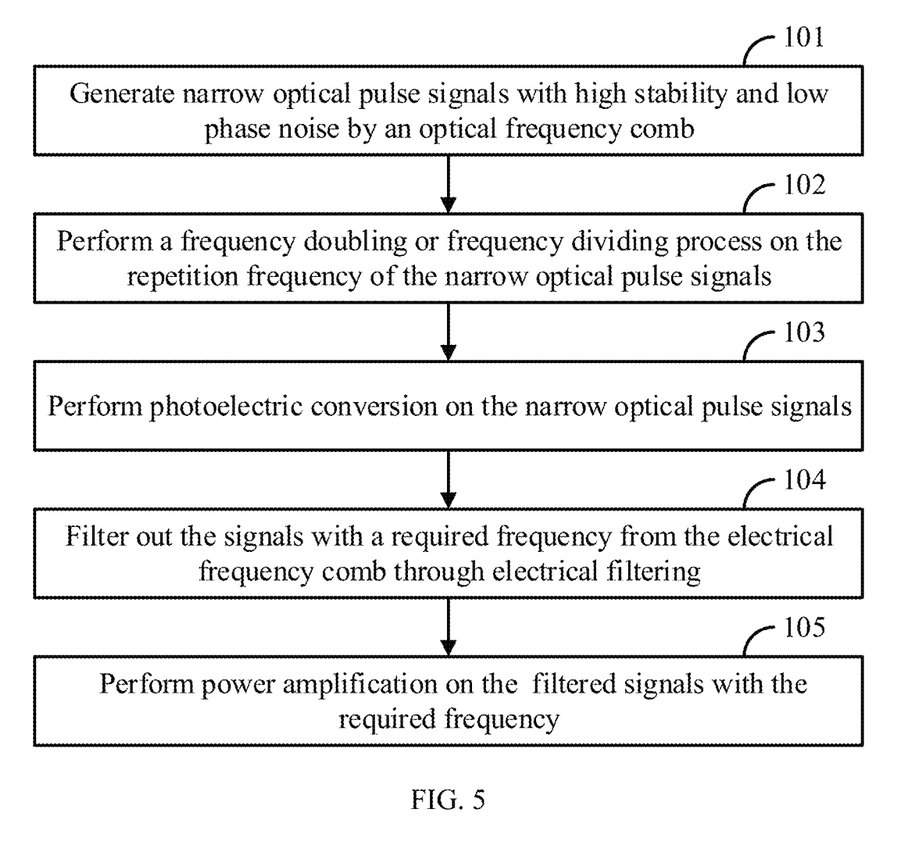
FIG. 5 is a flowchart of an embodiment of generating signals to be generated by using a direct photoelectric conversion method according to the present disclosure.

At block 2, generate the signals to be generated by using a direct photoelectric conversion method. In detail, block 2 includes the following:

At block 101, generate narrow optical pulse signals with high stability and low phase noise by an optical frequency comb.

At block 102, perform a frequency doubling or frequency dividing process on the repetition frequency of the narrow optical pulse signals generated by the optical frequency comb according to the frequency of the signals that are required to be generated.

At block 103, perform photoelectric conversion on the narrow optical pulse signals after the frequency doubling or frequency dividing process, and generate an electrical frequency comb.

At block 104, filter out the signals with a required frequency from the electrical frequency comb through electrical filtering.

At block 105, perform power amplification on the signals filtered in block 104 and obtain the signals with the required frequency.

At block 3, determine whether the frequency of the signals that is required to be generated is less than a predetermined frequency threshold, if it is determined that the frequency of the signals that is required to be generated is less than the predetermined frequency threshold, the process goes to block 4; if it is determined that the frequency of the signals that is required to be generated is greater than or equal to the predetermined frequency threshold, the process goes to block 5.

For example, if the frequency of the signals that is required to be generated is 350 MHz, the frequency is relatively low, block 4 can be performed to generate the frequency by electrical frequency synthesis; if the frequency of the signals that is required to be generated is 32.3 GHz, the frequency is relatively high, block 5 can be performed to generate the frequency by optical frequency shifting.

Figure 6:
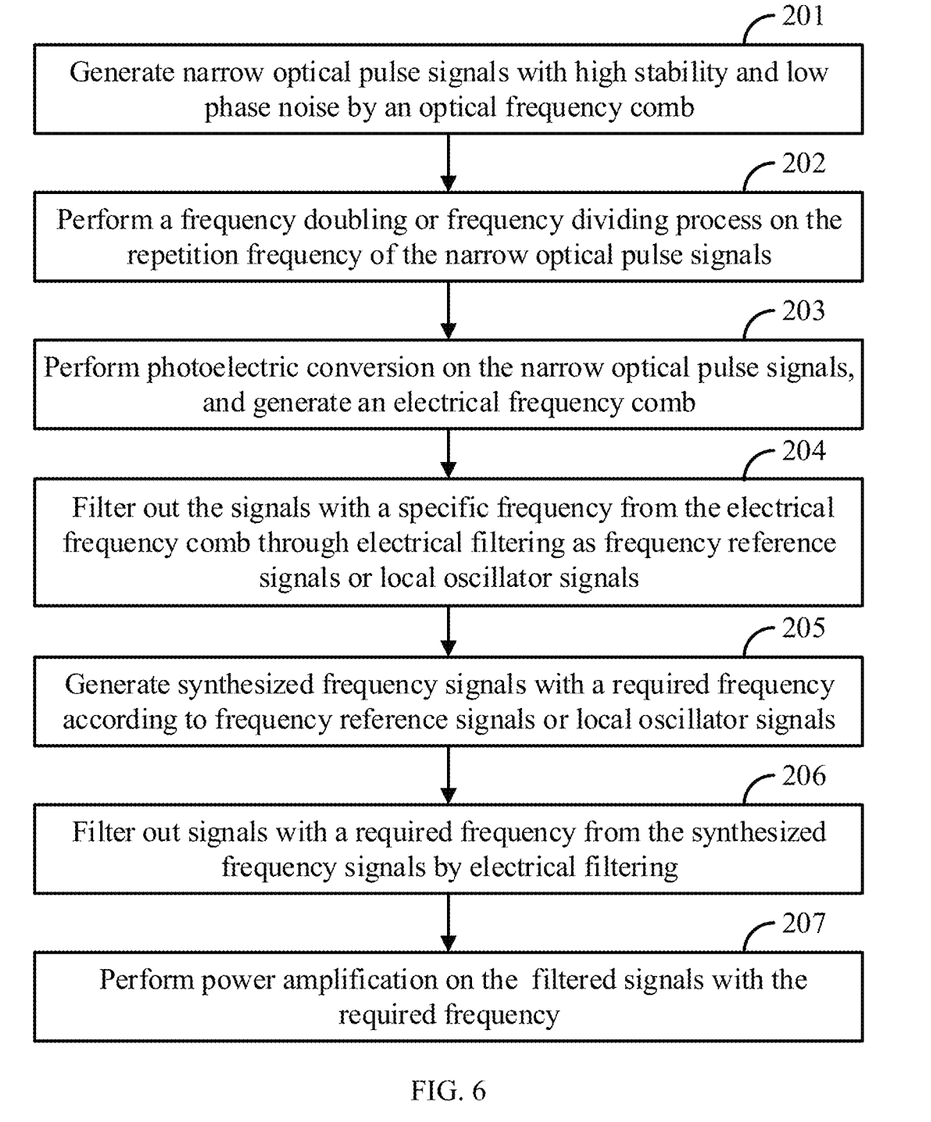
FIG. 6 is a flowchart of an embodiment of generating signals to be generated by using an electrical frequency synthesis method according to the present disclosure.

At block 4, generate the signals to be generated by using an electrical frequency synthesis method. In detail, block 4 includes the following:

At block 201, generate narrow optical pulse signals with high stability and low phase noise by an optical frequency comb.

At block 202, perform a frequency doubling or frequency dividing process on the repetition frequency of the narrow optical pulse signals generated by the optical frequency comb according to the frequency of the frequency reference signals or the local oscillator signals.

At block 203, perform photoelectric conversion on the narrow optical pulse signals after the frequency doubling or frequency dividing process, and generate an electrical frequency comb.

At block 204, filter out the signals with a specific frequency from the electrical frequency comb through electrical filtering as frequency reference signals or local oscillator signals.

At block 205, generate synthesized frequency signals with a required frequency according to the input frequency reference signals or local oscillator signals.

At block 206, filter out signals with a required frequency from the synthesized frequency signals by electrical filtering.

At block 207, perform power amplification on the signals filtered out in block 206 and obtain the signals with the required frequency.

Figure 7:
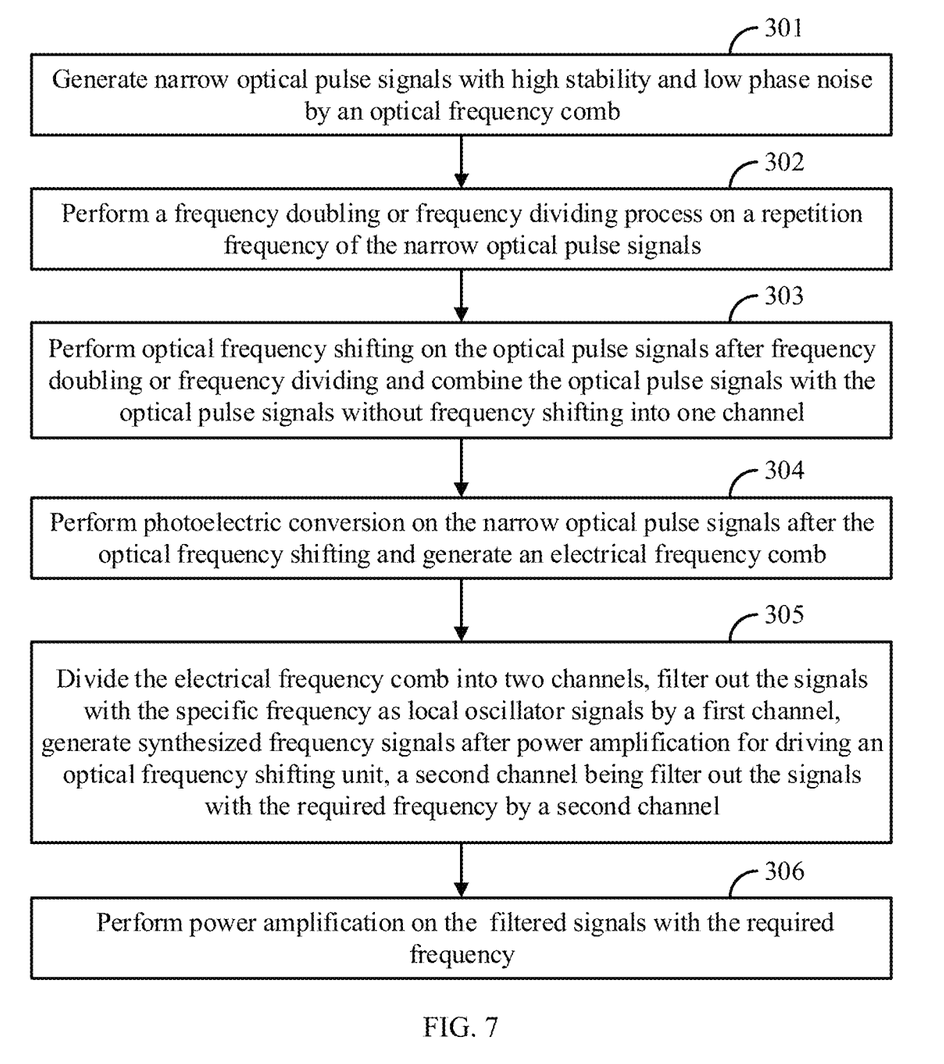
FIG. 7 is a flowchart of an embodiment of generating signals to be generated by using an optical frequency shifting method according to the present disclosure.

At block 5, generate the signals to be generated by using an optical frequency shifting method. In detail, block 5 includes the following:

At block 301, generate narrow optical pulse signals with high stability and low phase noise by an optical frequency comb.

At block 302, perform a frequency doubling or frequency dividing process on the repetition frequency of the narrow optical pulse signals generated by the optical frequency comb according to the frequency of the signals that is required to be generated.

At block 303, divide the optical pulse signals after the frequency doubling or frequency dividing process into two channels, perform optical frequency shifting on a first channel of the optical pulse signals by the optical frequency shifting unit, and combine the first channel of the optical pulse signals with a second channel of the optical pulse signals without frequency shifting into one channel.

At block 304, perform photoelectric conversion on the narrow optical pulse signals after the optical frequency shifting and generate an electrical frequency comb.

At block 305, divide the electrical frequency comb into two channels, filter out the signals with the specific frequency as the frequency reference signals or the local oscillator signals by a first channel of the electrical frequency comb through electrical filtering, generate synthesized frequency signals according to the frequency reference signals or the local oscillator signals, take the synthesized frequency signals after power amplification as the frequency shifting driving signals of the optical frequency shifting unit; filter out the signals with the required frequency by the second channel of the electrical frequency comb through electrical filtering.

At block 306, perform power amplification on the signals filtered out in block 305 and obtain the signal with the required frequency.

In this embodiment, the optical frequency comb is used as the frequency source, since the operation frequency of the optical frequency comb is three orders of magnitude or higher than that of common microwave frequency sources (e.g., the crystal oscillator), and its performance is three orders of magnitude or higher than that of the common microwave frequency sources, therefore, the frequency synthesis system provided in this embodiment can generates the frequency with a larger frequency range and higher performance. In addition, the frequency synthesis system can perform frequency shifting on the narrow optical pulse signals generated by the optical frequency comb, so as to obtain the frequency signals of ultra-wide band and continuous tuning.

Technical features in the above embodiments can be combined arbitrarily. For concise description, not all possible combinations of the technical features in the above embodiments are described. However, any combination of the technical features described in the above embodiments should fall within the scope of the present disclosure, as long as no conflict occurs between the combined technical features.

The above embodiments, which are described in detail, are merely some implementations of the present disclosure, but they should not be construed to limit the scope of the present disclosure. It should be pointed out that, various modifications and improvements can be made by those skilled in the art without departing from the concept of the present disclosure. These modifications and improvements shall be encompassed by the protection scope of the present disclosure as defined by the appended claims.

What is claimed is:

1. A frequency synthesis system of microwave photons based on photoelectric synergy, comprising:
an optical frequency comb configured to generate narrow optical pulse signals with high stability and low phase noise;
an optical frequency doubling/dividing unit configured to perform frequency doubling or frequency dividing on a repetition frequency of the narrow optical pulse signals output by the optical frequency comb;
a photoelectric conversion unit configured to perform photoelectric conversion on input optical pulse signals, and output an electrical frequency comb;
a second electrical filter unit configured to filter input electrical signals; and
a second electrical amplifying unit configured to perform power amplification on the input electrical signals;
the optical frequency comb being connected with the optical frequency doubling/dividing unit, the optical frequency doubling/dividing unit being connected with the photoelectric conversion unit, the photoelectric conversion unit being electrically connected with the second electrical filter unit, and the second electrical filter unit being electrically connected with the second electrical amplifying unit;
an electrical routing unit configured to perform path selection of the electrical signals by the electrical routing unit;
the photoelectric conversion unit being electrically connected with the second electrical filter unit through the electrical routing unit;
a first electrical filter unit configured to perform frequency selection of the electrical frequency comb; and
an electrical frequency synthesis unit configured to output synthesized frequency signals according to clock signals or local oscillator signals input by the electrical frequency synthesis unit;
an output end of the photoelectric conversion unit being electrically connected with a first input end of the electrical routing unit and electrically connected with the first electrical filter unit, the first electrical filter unit being electrically connected with the electrical frequency synthesis unit, and an output end of the electrical routing unit being electrically connected with the second electrical filter unit;
the electrical signals include the electrical frequency comb and the synthesized frequency signals.

2. The frequency synthesis system according to claim 1, further comprising:
a first optical routing unit configured to perform path selection when optical dividing; and
a second optical routing unit configured to perform path selection when optical combining;
wherein the optical frequency doubling/dividing unit is connected with the photoelectric conversion unit through the first optical routing unit and the second optical routing unit; an output end of the optical frequency doubling/dividing unit is connected with an input end of the first optical routing unit, a first output end of the first optical routing unit is connected with a first input end of the second optical routing unit, and an output end of the second optical routing unit is connected with the photoelectric conversion unit.

3. The frequency synthesis system according to claim 2, further comprising:
an optical dividing unit configured to divide optical pulse signals output by a second output end of the first optical routing unit into two channels, where a first channel is output to an optical combining unit, a second channel is output to an optical frequency shifting unit;
the optical combining unit configured to combine the optical pulse signals transmitted by the optical dividing unit and the optical frequency shifting unit into one channel and transmit the optical pulse signals to a second input end of the second optical routing unit;

the optical frequency shifting unit configured to perform an upward or downward frequency shifting process on the optical pulse signals transmitted from the optical dividing unit according to electrical frequency signals transmitted from a first electrical amplifying unit; and the first electrical amplifying unit being connected with the electrical frequency synthesis unit and configured to perform power amplification on the electrical signals output by the electrical frequency synthesis unit and transmit the electrical signals to the optical frequency shifting unit.

* * * * *